United States Patent [19]
Millar

[11] Patent Number: 5,917,760
[45] Date of Patent: Jun. 29, 1999

[54] DE-SKEWING DATA SIGNALS IN A MEMORY SYSTEM

[75] Inventor: Bruce Millar, Stittsville, Canada

[73] Assignee: SLDRAM, Inc., Palo Alto, Calif.

[21] Appl. No.: 08/933,713

[22] Filed: Sep. 19, 1997

Related U.S. Application Data

[60] Provisional application No. 60/026,895, Sep. 20, 1996, provisional application No. 60/055,349, Aug. 11, 1997, and provisional application No. 60/057,092, Aug. 27, 1997.

[51] Int. Cl.$^6$ ................................................. G11C 7/00
[52] U.S. Cl. ................ 365/194; 365/189.05; 365/230.08
[58] Field of Search ............................... 365/194, 189.05, 365/230.08

[56] References Cited

U.S. PATENT DOCUMENTS

| | | | |
|---|---|---|---|
| 5,500,808 | 3/1996 | Chang et al. | 365/189.05 |
| 5,544,124 | 8/1996 | Zagar et al. | 365/230.08 |
| 5,646,904 | 7/1997 | Ohno et al. | 365/233 |
| 5,666,322 | 9/1997 | Conkle | 365/233 |
| 5,768,177 | 6/1998 | Sakuragi | 365/194 |
| 5,841,707 | 11/1998 | Cline et al. | 365/194 |

Primary Examiner—David Nelms
Assistant Examiner—VanThu Nguyen
Attorney, Agent, or Firm—Fliesler, Dubb, Meyer & Lovejoy

[57] ABSTRACT

The present invention provides for a method of operation for a memory system having a memory controller integrated circuit, a plurality of memory integrated circuits, particularly DRAMs, and a plurality of signal lines connected to memory controller and the memory integrated circuits. To avoid the problem of the problem of skew between the signals to and from the DRAMs, the method of operation determines a delay between an issued read command and receipt of signals from a selected DRAM by the controller integrated circuit in response to the read command, and sets a read delay in the selected DRAM. Further steps in the operation include the determination of the delay between an issued read command and the receipt of signals from each one of the DRAMs by the memory controller integrated circuit in response to a read command, and setting the read delay in each one of the DRAMs so that the delays between an issued read command and receipt of signals from each one of the DRAMs by the controller integrated circuit are equal. Besides the operating speeds of the individual DRAMs, skew which is dependent upon the position of the DRAMs along a bus caused by bus loading effects, signal reflections, noise, etc., is reduced, if not eliminated.

7 Claims, 4 Drawing Sheets

Command and Data Sync Patterns

| SIGNAL | REPEATING PATTERN |
|---|---|
| Flag | 1111010110010000... |
| CA9 | 0000101001101111... |
| CA8 | 1111010110010000... |
| CA7 | 0000101001101111... |
| CA6 | 1111010110010000... |
| CA5 | 0000101001101111... |
| CA4 | 1111010110010000... |
| CA3 | 0000101001101111... |
| CA2 | 1111010110010000... |
| CA1 | 0000101001101111... |
| CA0 | 1111010110010000... |
| DQ17 | 0000101001101111... |
| DQ16 | 1111010110010000... |
| DQ15 | 0000101001101111... |
| DQ14 | 1111010110010000... |
| DQ13 | 0000101001101111... |
| DQ12 | 1111010110010000... |
| DQ11 | 0000101001101111... |
| DQ10 | 1111010110010000... |
| DQ9 | 0000101001101111... |
| DQ8 | 1111010110010000... |
| DQ7 | 0000101001101111... |
| DQ6 | 1111010110010000... |
| DQ5 | 0000101001101111... |
| DQ4 | 1111010110010000... |
| DQ3 | 0000101001101111... |
| DQ2 | 1111010110010000... |
| DQ1 | 0000101001101111... |
| DQ0 | 1111010110010000... |
| DCLK1 | 10... |
| DCLK0 | 10... |

*FIG. 3*

DE-SKEWING DATA SIGNALS IN A MEMORY SYSTEM

CROSS REFERENCE TO RELATED APPLICATIONS

This application claims priority from the following U.S. Provisional Applications, each of which, including all appendices and attached documents, are incorporated by reference in their entirety for all purposes:

Application Ser. No. 60/026,895, filed Sep. 20, 1996, entitled "SyncLink Roundtrip Deskew";

Application Ser. No. 60/055,349 filed Aug. 11, 1997, entitled "SLDRAM Architecture"; and, Application Ser. No. 60/057,092, filed Aug. 27, 1997, entitled "SLDRAM Architecture."

The following copending U.S. Patent Applications are hereby incorporated by reference in their entirety for all purposes:

Application Ser. No. 08/818,068, filed Mar. 14, 1997, entitled "Variable CMOS Vernier Delay", based on Provisional application Ser. No. 60/033,981 filed Dec. 31, 1996;

Application Ser. No. 08/909,299 filed Aug. 11, 1997, entitled "Bifurcated Data and Command/address Communication Bus Architecture for Random Access Memories Employing Synchronous Communication Protocols";

Application Ser. No. 60/055,368 filed Aug. 11, 1997, entitled "A High-Speed Memory Interface (SyncLink)";

Application Ser. No. 08/933,673, filed Sep. 19, 1997, both entitled "Read/Write Timing for Maximum Utilization of Bi-Directional Read/Write Bus" by Peter B. Gillingham; and Application Ser. No. 08/933,710, filed Sep. 19, 1997, entitled "High-Speed Bus Structure for Printed Circuit Boards" by Bruce Millar.

BACKGROUND OF THE INVENTION

The present invention is related to high speed memory systems and, more particularly, to computer memory systems operating with a memory controller and DRAM integrated circuits.

In computer memory systems, particularly what is often termed the main memory, information is typically stored in dynamic random-access-memory (DRAM) integrated circuits. The DRAMs are connected by a plurality of data and control buses, and other signal lines to a memory controller integrated circuit, which manages the operations of the DRAMs.

There are various issues which must be faced for high speed operations of a memory system. For example, the memory system is commonly formed in one or more printed circuit boards to which the integrated circuits are mounted. The signal lines which interconnect the integrated circuits are formed inside and on the surfaces of the printed circuit boards. High speed operation is not only limited by the operational speed of the constituent integrated circuits, but also by the fundamental characteristics of the printed circuit board signal lines over which the integrated circuits communicate. The characteristics include the raw bandwidth capability of the signal lines, the propagation delay of a signal from a driving component to a receiving component, signal integrity, noise immunity, skew, and so on. U.S. patent application No. 08/933,710, filed of even date by the present inventor, entitled, "HIGH-SPEED BUS STRUCTURE FOR PRINTED CIRCUIT BOARDS," and incorporated herein by reference, discloses improvements to the bus signal lines on a printed circuit.

On the other hand, the problem of skew between the signals to and from the constituent integrated circuits has heretofore been addressed by the selection of integrated circuits having, more or less, the same speed of operation. Stated differently, the integrated circuits of the system are selected so that their access times are the same. However, while the selection of DRAMs with matched access times helps alleviate some of the problems of skewed signals, it does not solve all the problems completely. For example, besides the operating speeds of the individual DRAMs, skew which is dependent upon the position of the DRAMs along a bus caused by bus loading effects, signal reflections, noise, etc., still remains.

The present invention is directed toward solving or substantially ameliorating the problem of skewed signals to achieve a memory system in which skew is minimized.

SUMMARY OF THE INVENTION

The present invention provides for a method of operation in a memory system having a memory controller integrated circuit, a plurality of memory integrated circuits, particularly DRAMs, and a plurality of signal lines connected to memory controller and the memory integrated circuits. The method of operation comprises selecting one of the memory integrated circuits, issuing a read command from the controller integrated circuit to the selected memory integrated circuit, determining a delay between the issued read command and receipt of signals from the selected memory integrated circuit by the controller integrated circuit in response to the read command, and setting a read delay in the selected memory integrated circuit. Further steps in the operation include performing the same steps to determine the delay between an issued read command and the receipt of signals from each one of the memory integrated circuits by the memory controller integrated circuit in response to the read command, and setting the read delay in each one of the memory integrated circuits so that the delays between an issued read command and receipt of signals from each one of the memory integrated circuits by the controller integrated circuit are equal.

In a similar manner, the present invention provides for a method of operation in a memory system by which the delays between an issued write command by the memory controller integrated circuit and the writing of signals into each one of the memory integrated circuits are equal.

BRIEF DESCRIPTION OF THE DRAWINGS

FIG. 3 is a table of signals for synchronizing operations between DRAMs and a memory controller in the FIG. 1 system.

DETAILED DESCRIPTION OF SPECIFIC EMBODIMENTS

Figure 1:
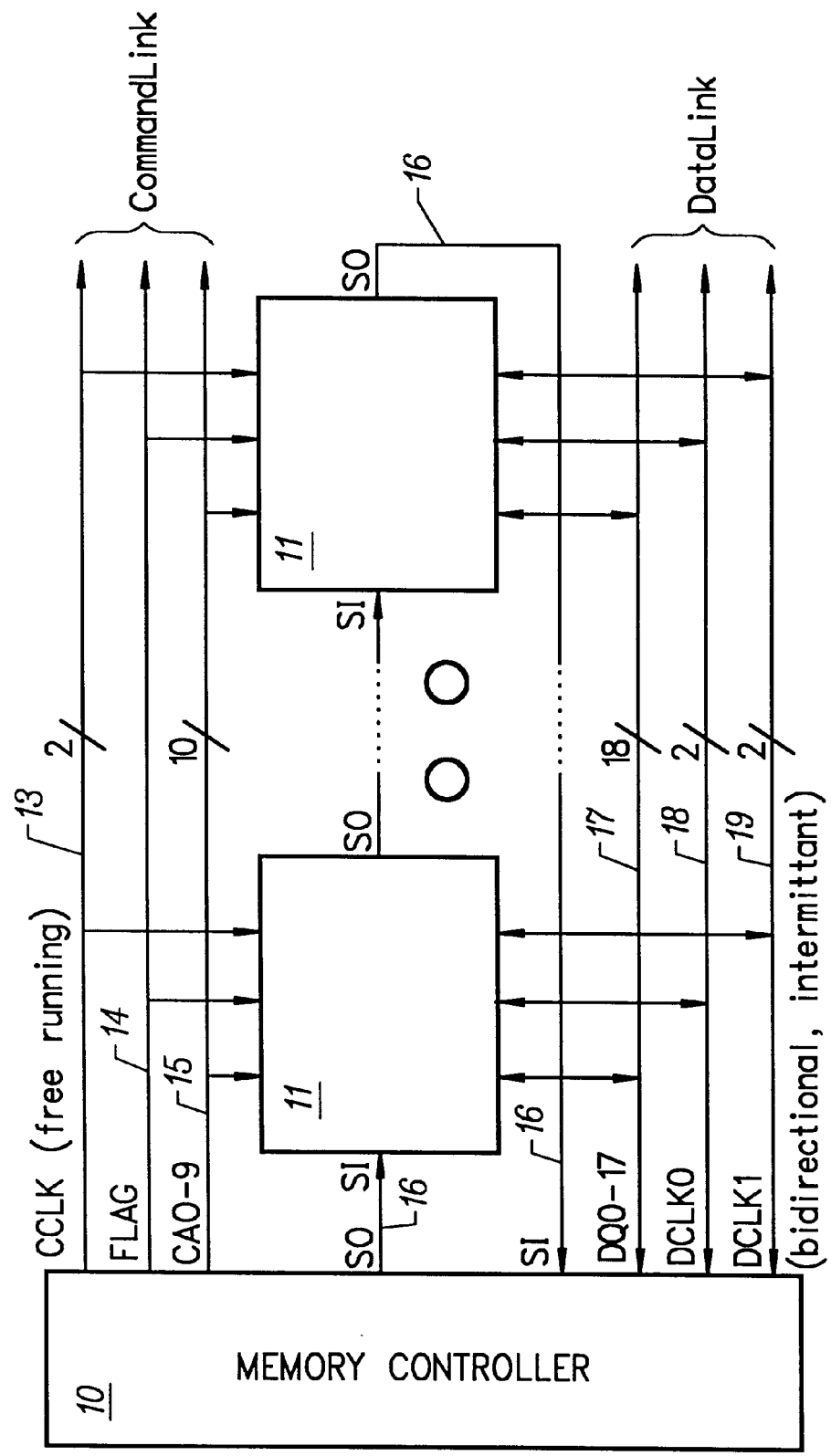
FIG. 1 is a block diagram of a memory system, according to the present invention.

FIG. 1 illustrates a memory system according to one embodiment of the present invention. Only details directed toward the present invention are disclosed; other details may be found in U.S. Provisional patent application No. 60/055, 349, filed Aug. 11, 1997 by Kevin Ryan et al., entitled, "SLDRAM Architecture" (Attorney's Docket No. 017938-000900), and incorporated herein by reference.

In the FIG. 1 memory system, a memory controller integrated circuit 10 is connected to a plurality of DRAM integrated circuits 11, of which only two are shown for purposes of illustration, by several signal lines. Command, address and control information from the memory controller 10 is sent to the DRAMs 11 on a unidirectional Command Link which has, among other signal lines, two clock signal lines 13, CCLK and its complement CCLK*, a FLAG signal line 14, and a 10-bit CA[9:0] bus 15, which carries command and address signals. Read and write data are exchanged between the controller 10 and the DRAMs 11 over a bi-directional Data Link which has an 18-bit DQ[17:0] data bus 17, true and complementary clock signal lines 18 for clock signals, DCLK0 and DCLK0*, and true and complementary clock signal lines 19 for clock signals, DCLK1 and DCLK1*. The DQ data bus 17 carries write data from the controller 10 to the DRAMs 11 and read data from the DRAMs 11 to the controller 10. Two bits of the Data Link are parity check bits.

Command and address signals from the controller 10 are sent over the CA bus 15 in packets of 10-bit words. Data are transferred in minimum burst lengths of four 18-bit words accompanied by one of the differential clock signals, DCLK0/DCLK0* or DCLK1/DCLK1*, driven by the source of the data.

The system also has a daisy-chained serial signal line 16 connected to input terminals SI and output terminals SO on each integrated circuit 10 and 11. The signal line 16 is used to synchronize the DRAMs 11 upon power up and to assign a unique identification number to each DRAM 11.

Figure 2A:
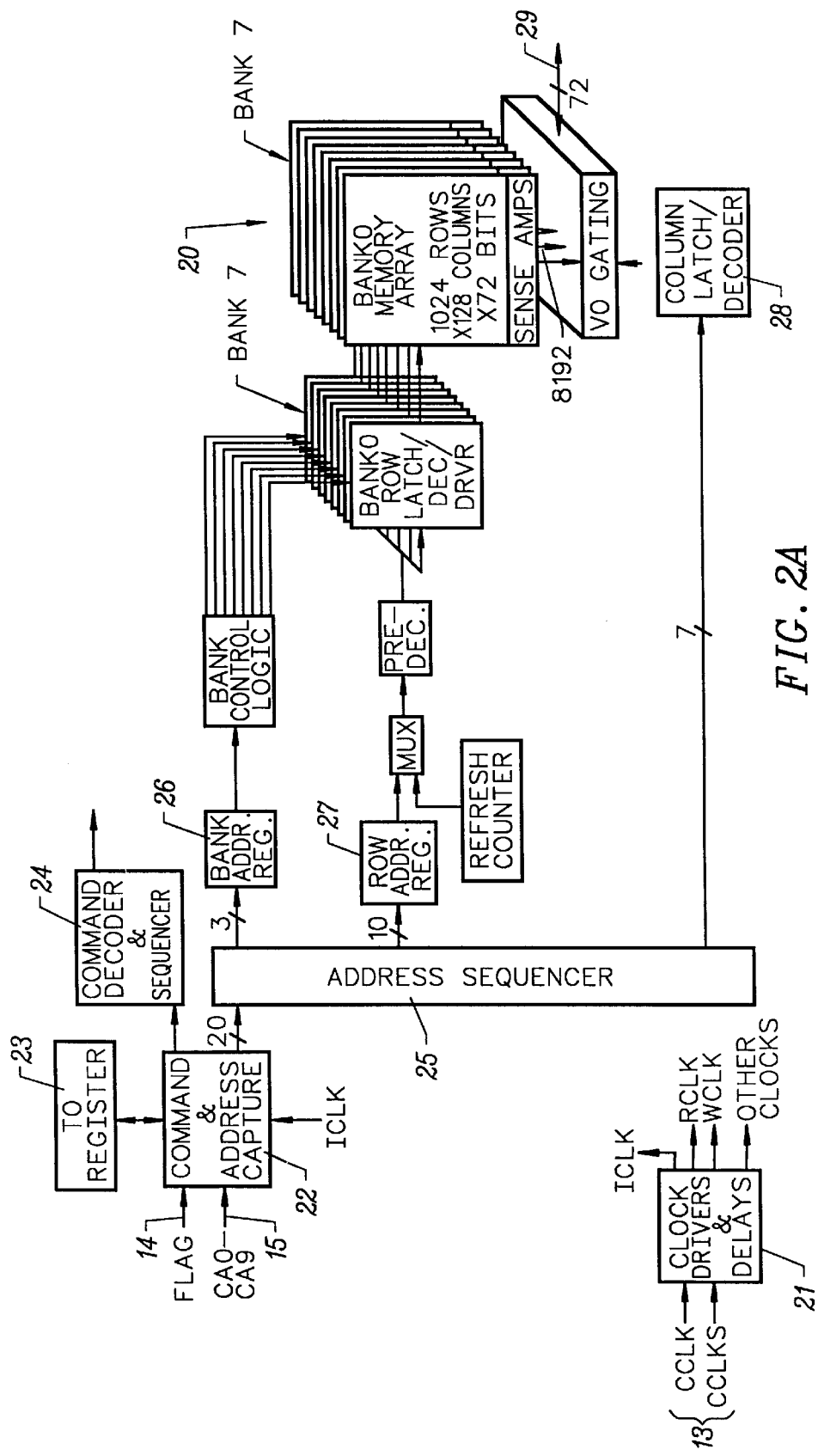
FIGS. 2A and 2B illustrate the functional blocks of a DRAM integrated circuit in the FIG. 1 memory system.
Figure 2B:
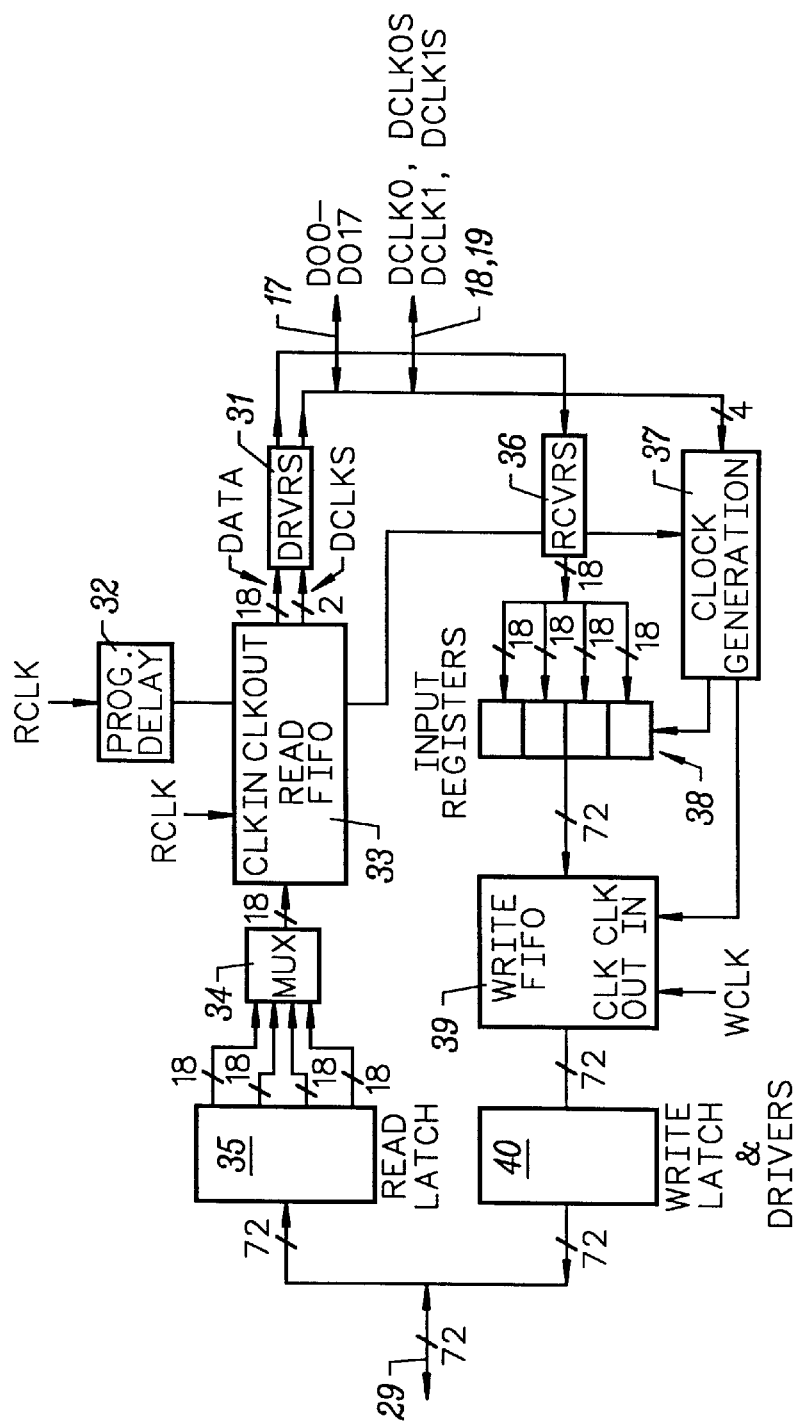

FIGS. 2A and 2B illustrate the organization of one of the DRAMs 11. As shown in FIG. 2A, the DRAM 11 has a memory cell core 20 arranged into eight banks of 128K×72 memory cells. Each 128K×72 bank has 1024 rows by 128 columns by 72 memory cells. The 72 bits per column access to and from the memory core 20 are transferred in a burst of four 18-bit words. Timing signals within the DRAM 11 are generated by a Clock Divider and Delay block 21 which receives the CCLK and CCLK* clock signals on lines 13. The FLAG control signal on the line 14 and the command/address signals on the CA bus 15 are received by a Command and Address Capture latch 22, which communicates with an ID register 23, a Command Decoder and Sequencer block 24, and an Address Sequencer block 25. The ID register 23 holds the particular unique combination of bits to identify each DRAM 11 in the memory system. The Command Decoder and Sequencer block 24 generates the control signals to operate the DRAM 11 from command bits in the latch 22. The Address Sequencer block 25 directs the address bits in the latch 22 to a Bank Address register 26, Row Address register 27 and a Column Latch Decoder 28. These units 26, 27 and 28 through logic, decoder and driver circuits, access 72 memory cells in the memory core 20 at a time for reading and writing operations. A bus 29 handles the transfer of 72 bits to and from the accessed cells in the memory core 20.

The functional units which directly handle the transfer of data and clock signals to and from the DRAM 11 are shown in FIG. 2B. For a write operation into the memory core 20, data from the DQ bus 17 is transferred by receiving buffers 36 from the DQ bus 17 to four input registers 38. The registers 38 assemble the 18-bit words from the DQ bus 17 into 72 bits, which are transferred into a Write FIFO 39. From the FIFO 39 the data is moved to a Write Latch and Driver circuit 40 and onto the bus 29 for transfer into the memory core 20. Timing of these operations is controlled by the operative clock signals on one of the pairs of DCLK0/DCLK0* and DCLK1/DCLK1* clock signal lines 18, 19, which are connected to a Clock Generation block 37. In turn, the Clock Generation block 37, which has its operational speed controlled by the the Programmable Delay block 32, is connected to clock input terminals of the four input registers 38 and the Write FIFO 39.

For a read operation, data from the core 20 is transferred over the bus 29 into a Read latch 35 which is connected to a multiplexer 34. The multiplexer 34 selects 18 bits from the 72-bit latch 35 at a time for transfer into a Read FIFO 33. The FIFO 33 not only transfers the data bits from the multiplexer 34, but also transfers clock signals for the DCLK0 and the DCLK1 signals. Timing for the FIFO 33 is responsive to a Programmable Delay Register block 32. A Driver block 31 transfers the data from the FIFO 33 onto the DQ bus 17 and generates the complements of DCLK0 and the DCLK1 signals so that all four clock signals can be driven unto the four clock signal lines 18, 19.

For maximum operation of the memory system, the controller 10 programs each DRAM 11 with four timing parameters: Page read latency, page write latency, Bank read Latency and Bank Write Latency. Latency is the time between the command burst and the start of the associated data burst. For consistent operation of the memory system, each DRAM 11 is programmed to obtain equal times for the four different latencies with reference to the input/output terminals of the controller 10. Due to different round-trip bus delays through the DRAMs 11 at different bus positions, the presence or absence of buffer circuits and varying performance of individual DRAMs 11, the actual values programmed in each DRAM 11 may differ considerably. The DRAMs 11 are calibrated at a system level, rather than at a component level. This permits compensation for wide variation in individual device parameters.

On power up reset, latency registers in the Programmable Delay block 32 in each DRAM 11 are set to their minimum values. Details of registers useful for setting delay intervals, coarse and fine, are disclosed in U.S. application Ser. No. 08/818,068, filed on Mar. 14, 1997 by Chaogang Huang et al., entitled, "Variable CMOS Vernier Delay," and which is incorporated by reference herein. The controller 10 observes the response of each DRAM 11 and then makes the appropriate adjustments to obtain consistent operations. Read latency is adjustable in coarse increments of intervals of one-half of a CCLK cycle and in fine increments of a fractional interval. The controller 10 programs the coarse and fine read latency of each DRAM 11 so that read data burst from different devices, at different electrical distances from the controller 10, all arrive back at the controller 10 with equal delay from the command packet. Likewise, the controller 10 adjusts the write latency, which is only adjustable in coarse increments, of each DRAM 11. The write latency values determine when a DRAM 11 begins looking for transitions on DCLK signals in order to strobe in write data.

The process begins when the memory system is powered up and reset. As stated previously, the latency registers in each DRAM 11 are set to their minimum values. Likewise, an 8-bit ID register in each DRAM 11, which is used to identify that device, is set to 255. The DRAMs 11 are initialized and synchronized with the memory controller 10 for receiving command signals and write data. The controller 10 begins transmitting CCLK and drives DCLK signals with continuous transitions and sets its output terminal SO=1 for the daisy-chained signal line 16. On the DQ[17:0], CA[9:0] and FLAG signal lines, the controller 10 transmits inverted and non-inverted versions of a 15-bit pseudo-random sequence, "111101011001000". These signal patterns are shown in a table in FIG. 3. The DRAMs 11 recognize this sequence by two consecutive 1's on the FLAG bit signal. Each DRAM 11 then determines an optimum internal delay for the CCLK/CCLK*, DCLK0/DCLK0*, and DCLK1/DCLK1* clock signals to optimally sample incoming bits.

Before the DRAM 11 has synchronized, it sets its own output terminal SO=0. Once the DRAM 11 has synchronized and the appropriate delays for CCLK, DLK0 and DCLK1 clock signals have been programmed, the DRAM 11 sets its output terminal SO equal to the signal received at its input terminal, SO=SI. When all the DRAMs 11 are synchronized, the controller receives a logic "1" at its SI input terminal and the controller 10 stops sending the pattern. The controller 10 then resets its output terminal SO=0, which signal ripples through all the DRAMs 11.

An identification number is then sequentially assigned to each DRAM 11. The controller 10 sets its output terminal SO=1 once again and sends an "ID Register Write" command with write data 0. Only the DRAM 11 which receives the SI=1 signal and has its ID Register set at 255 responds to this command. This DRAM 11 overwrites its ID register with the value "0" and sets SO=1. The controller 10 repeats the "ID Register Write" command with write data "1" and so on, until all the DRAMs 11 have their ID register overwritten. At that point, the controller 10 observes a "1" on its SI input terminal.

With the identification of each DRAM 11 in the memory system, read operations are synchronized for each DRAM 11. The controller 10 issues a "Read Sync" command to a DRAM 11, which then transmits continuous transitions on both sets of DCLK clock signal lines 18 and 19, and the 15-bit pseudo-random synchronization pattern on the DQ[17:0] 17. Since the latency registers in each DRAM 11 had been set to their minimum values, the selected DRAM 11 returns the data pattern at its minimum read delay. The minimum delay for each DRAM 11 is not known by the controller 10 at this point. The controller 10 first adjusts the position of the data burst by issuing a "Increment Fine Vernier Event" command to the DRAM 11. The delay between the DQ data signal edges relative to DCLK clock signal edges is adjusted by an "Increment/Decrement DCLK Offset Event" command to the DRAM 11 so that the bit pattern on the DQ bus 17 can be optimally captured by the controller 10. The controller 10 then terminates the synchronization procedure by issuing a "Stop Read Sync" command. After this synchronization procedure is performed for each DRAM 11, the controller 11 can read data from each DRAM 11 at the minimum latency for that device.

Finally, to detect the read latencies of each DRAM 11 in the system, the controller 10 issues a "DRIVE DCLK=0" command, which is followed by a "Read" command. The controller 10 monitors the specific DCLK clock signals for the transitions which accompany the data burst to measure latency. Once the minimum latencies have been measured for each DRAM 11, the appropriate read latency value is determined and programed into each device by the writing to a Read Delay Register, one of the latency registers in the Programmable Delay block 32. Optimally, the DRAMs 11 with the shorter observed read latencies are programmed with additional latency so as to match the DRAM with the longest observed read latency. In this manner, all the read data arrives at the controller 10 with the same latency from command to data, regardless of which DRAM 11 provided the data.

To determine write latency of each of the DRAMs 11, the controller 10 issues to a DRAM 11 a write command to a particular location in the DRAM 11 and an extended count of data on the DQ bus 17 with an accompanying DCLK signal. Words in the write burst are incremented 0, 1, 2, 3, . . . , 31. After the Write command, the controller 10 reads the location addressed by the Write command. The first word contains the minimum write latency. With this information the controller 10 can set the write latencies of all the DRAMs 11 to a common value by writing to a Write Delay Register, another of the latency registers in the Programmable Delay block 32.

In this manner, skew in signals between DRAMs 11 is avoided. The controller 10 in a read operation receives its requested data at a certain time after a read command has issued, no matter which DRAM 11 is the source of data. Likewise, in a write operation, data bits are captured by a DRAM 11 at a certain time, no matter where the DRAM is located.

While the foregoing is a complete description of the embodiments of the invention, various modifications, alternatives and equivalents may be used. Accordingly, the above description should not be taken as limiting the scope of the invention which is defined by the metes and bounds of the appended claims.

What is claimed is:

1. A method of operating a memory system having a memory controller integrated circuit, memory integrated circuits, and signal lines connecting the memory controller and the memory integrated circuits, the method comprising the steps of:

issuing a read command from said controller integrated circuit to each one of said memory integrated circuits;

determining a delay between said issued read command and receipt of signals from each one of said memory integrated circuits by said controller integrated circuit in response to said read command; and setting read delays so that said delays between said issued read command and receipt of signals from each one of said memory integrated circuits by said controller integrated circuit in response to said read commands are equal.

2. The method of claim 1 wherein each of said memory integrated circuits comprises a DRAM.

3. The method of claim 2, wherein the step of setting read delays comprises setting a read delay in each one of the DRAMs.

4. The method of claim 3, wherein the read delay in each one of the DRAMs is set by writing a value to a read register of a programmable delay device in each one of the DRAMs, each of the programmable delay devices causing a delay in a clock signal provided to a FIFO buffer that provides signals to the controller integrated circuit.

5. A method of operating a memory system having a memory controller integrated circuit, memory integrated circuits, and signal lines connecting the memory controller and the memory integrated circuits, the method comprising the steps of:

issuing a write command from the controller integrated circuit to each one of said memory integrated circuits;

issuing a read command from the controller integrated circuit to each one of said memory integrated circuits to read data written using said write command;

determining a delay between said issued write command and receipt of written data from each one of said memory integrated circuits by said controller integrated circuit in response to said read command; and setting a write delay in each one of said memory integrated circuits so that said delays between said issued write commands and receipt of the written data from each one of said memory integrated circuits by said controller integrated circuit in response to said read commands are equal.

6. The method of claim 5 wherein each of said memory integrated circuits comprises a DRAM.

7. The method of claim 6, wherein the write delay in each one of the DRAMs is set by writing a value to a write register of a programmable delay device in each one of the DRAMs, each of the programmable delay devices causing a delay in a clock signal provided to a FIFO buffer that provides signals to the controller integrated circuit.

* * * * *